(12) United States Patent
Kwark

(10) Patent No.: US 10,818,572 B2
(45) Date of Patent: Oct. 27, 2020

(54) INTEGRATED CIRCUIT CHIP PACKAGING INCLUDING A HEAT SINK TOPPED CAVITY

(71) Applicant: International Business Machines Corporation, Armonk, NY (US)

(72) Inventor: Young Hoon Kwark, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 238 days.

(21) Appl. No.: 15/589,108

(22) Filed: May 8, 2017

(65) Prior Publication Data
US 2017/0243802 A1    Aug. 24, 2017

Related U.S. Application Data

(63) Continuation of application No. 11/411,920, filed on Apr. 27, 2006, now Pat. No. 9,713,258.

(51) Int. Cl.
*H01L 23/36* (2006.01)
*H01L 23/49* (2006.01)
(Continued)

(52) U.S. Cl.
CPC ........ *H01L 23/3675* (2013.01); *H01L 21/481* (2013.01); *H01L 21/4882* (2013.01); *H01L 23/13* (2013.01); *H01L 23/3672* (2013.01); *H01L 23/3677* (2013.01); *H01L 23/49827* (2013.01); *H01L 23/49838* (2013.01);
(Continued)

(58) Field of Classification Search
CPC . H01L 23/3675; H01L 23/13; H01L 23/3672; H01L 23/3677; H01L 23/49827; H01L 23/49838; H01L 23/66; H01L 24/16; H01L 24/40; H01L 24/45; H01L 24/48; H01L 24/49; H01L 24/73; H01L 25/165; H05K 1/183; H05K 2201/0919; H05K 2201/092; H05K 2201/09754; H05K 2201/09845; H05K 2201/09036
See application file for complete search history.

(56) References Cited

U.S. PATENT DOCUMENTS 4,715,115 A    12/1987    King et al.
4,855,868 A    8/1989    Harding
(Continued)

OTHER PUBLICATIONS

United States Office Action dated Aug. 7, 2019 in U.S. Appl. No. 15/589,131.
(Continued)

*Primary Examiner* — Ida M Soward
(74) *Attorney, Agent, or Firm* — Daniel P. Morris; McGinn IP Law Group, PLLC

(57) ABSTRACT

An electrical circuit device includes a circuit board including a cavity extending from a top surface of the circuit board to an embedded conductor, an integrated circuit chip in the cavity, an electrical connection between the integrated circuit chip and the embedded conductor, a thermal slug disposed over a top surface of the integrated circuit chip, and a heat sink mounted to an outer surface of the thermal slug for transferring a thermal energy away from the circuit board, the heat sink extending above a top surface of the circuit board.

20 Claims, 5 Drawing Sheets

(51) Int. Cl.
*H01L 23/66* (2006.01)
*H01L 25/16* (2006.01)
*H05K 1/18* (2006.01)
*H01L 23/367* (2006.01)
*H01L 23/00* (2006.01)
*H01L 23/13* (2006.01)
*H01L 23/498* (2006.01)
*H01L 21/48* (2006.01)

(52) U.S. Cl.
CPC .............. *H01L 23/66* (2013.01); *H01L 24/16* (2013.01); *H01L 24/40* (2013.01); *H01L 24/45* (2013.01); *H01L 24/48* (2013.01); *H01L 24/49* (2013.01); *H01L 24/73* (2013.01); *H01L 25/165* (2013.01); *H05K 1/183* (2013.01); *H01L 2223/6627* (2013.01); *H01L 2224/16* (2013.01); *H01L 2224/16225* (2013.01); *H01L 2224/16235* (2013.01); *H01L 2224/40105* (2013.01); *H01L 2224/40237* (2013.01); *H01L 2224/45014* (2013.01); *H01L 2224/48091* (2013.01); *H01L 2224/48471* (2013.01); *H01L 2224/48472* (2013.01); *H01L 2224/49109* (2013.01); *H01L 2224/49433* (2013.01); *H01L 2224/73221* (2013.01); *H01L 2924/00014* (2013.01); *H01L 2924/014* (2013.01); *H01L 2924/01006* (2013.01); *H01L 2924/01027* (2013.01); *H01L 2924/01029* (2013.01); *H01L 2924/01033* (2013.01); *H01L 2924/01047* (2013.01); *H01L 2924/01078* (2013.01); *H01L 2924/01079* (2013.01); *H01L 2924/14* (2013.01); *H01L 2924/15153* (2013.01); *H01L 2924/15192* (2013.01); *H01L 2924/1903* (2013.01); *H01L 2924/19031* (2013.01); *H01L 2924/3011* (2013.01); *H01L 2924/3025* (2013.01); *H05K 2201/092* (2013.01); *H05K 2201/0919* (2013.01); *H05K 2201/09036* (2013.01); *H05K 2201/09845* (2013.01); *H05K 2203/049* (2013.01)

(56) References Cited

U.S. PATENT DOCUMENTS

| | | | | |
|---|---|---|---|---|
| 4,866,571 A * | 9/1989 | Butt | ...................... | H01L 23/047 361/717 |
| 4,922,324 A * | 5/1990 | Sudo | ................... | H01L 23/3677 257/700 |
| 5,008,734 A * | 4/1991 | Dutta | .................... | H01L 23/047 257/693 |
| 5,175,613 A | 12/1992 | Barker, III et al. | | |
| 5,225,709 A * | 7/1993 | Nishiuma | ............. | H01L 23/642 257/692 |
| 5,235,211 A * | 8/1993 | Hamburgen | ............ | H01L 23/13 257/758 |
| 5,272,590 A * | 12/1993 | Hernandez | ............... | H01G 4/35 361/306.2 |
| 5,280,409 A * | 1/1994 | Selna | .................. | H01L 23/4006 361/720 |
| 5,293,069 A * | 3/1994 | Kato | ....................... | H01L 23/04 257/698 |
| 5,365,406 A * | 11/1994 | Kurashima | ....... | H01L 23/49827 174/261 |
| 5,468,999 A * | 11/1995 | Lin | ........................ | H01L 23/24 257/700 |
| 5,478,420 A | 12/1995 | Gauci et al. | | |
| 5,490,324 A * | 2/1996 | Newman | ............. | H01L 23/3128 174/534 |
| 5,508,556 A | 4/1996 | Lin | | |
| 5,545,598 A | 8/1996 | Ogawa et al. | | |
| 5,583,378 A * | 12/1996 | Marrs | ..................... | H01L 24/97 257/710 |
| 5,597,643 A * | 1/1997 | Weber | ................. | H01L 21/4857 174/255 |
| 5,625,225 A * | 4/1997 | Huang | .................. | H01L 23/055 257/691 |
| 5,689,091 A * | 11/1997 | Hamzehdoost | ..... | H01L 23/3121 174/255 |
| 5,696,666 A | 12/1997 | Miles et al. | | |
| 5,701,233 A * | 12/1997 | Carson | ................ | H01L 25/0652 361/735 |
| 5,710,459 A * | 1/1998 | Teng | ........................ | H01L 23/10 257/704 |
| 5,796,170 A * | 8/1998 | Marcantonio | ........... | H01L 23/24 257/691 |
| 5,814,883 A * | 9/1998 | Sawai | ...................... | H01L 23/04 257/712 |
| 5,831,833 A | 11/1998 | Shirakawa et al. | | |
| 5,847,935 A * | 12/1998 | Thaler | .................... | H01L 23/049 361/761 |
| 5,886,408 A | 3/1999 | Ohki et al. | | |
| 5,986,884 A * | 11/1999 | Jairazbhoy | ........... | H05K 1/0272 165/104.33 |
| 6,008,988 A * | 12/1999 | Palmer | .................... | H01L 23/36 174/16.3 |
| 6,014,318 A * | 1/2000 | Takeda | .................... | H01L 23/13 174/255 |
| 6,043,559 A * | 3/2000 | Banerjee | ................. | H01L 23/13 257/591 |
| 6,054,758 A * | 4/2000 | Lamson | ............ | H01L 23/49822 257/691 |
| 6,075,700 A | 6/2000 | Houghton et al. | | |
| 6,081,028 A | 6/2000 | Ettehadieh et al. | | |
| 6,090,237 A * | 7/2000 | Reynolds | ............ | B32B 37/0023 156/323 |
| 6,175,497 B1 * | 1/2001 | Tseng | ....................... | H01L 23/36 257/706 |
| 6,236,568 B1 | 5/2001 | Lai et al. | | |
| 6,278,400 B1 * | 8/2001 | Cassen | ...................... | G01S 7/03 342/175 |
| 6,282,095 B1 * | 8/2001 | Houghton | ........... | H01L 23/3675 165/80.2 |
| 6,323,066 B2 | 11/2001 | Lai | | |
| 6,333,856 B1 * | 12/2001 | Harju | ...................... | H01L 23/13 257/723 |
| 6,359,341 B1 * | 3/2002 | Huang | .................... | H01L 23/13 257/700 |
| 6,393,696 B1 * | 5/2002 | Yoon | ...................... | H01L 21/481 257/E23.063 |
| 6,395,582 B1 * | 5/2002 | Sohn | .................. | H01L 23/3128 257/E23.101 |
| 6,428,908 B1 | 8/2002 | Beutel | | |
| 6,469,592 B2 | 10/2002 | Huang et al. | | |
| 6,487,083 B1 | 11/2002 | Kwong | | |
| 6,521,990 B2 | 2/2003 | Roh et al. | | |
| 6,535,388 B1 * | 3/2003 | Garcia | .................... | H01L 23/24 165/80.3 |
| 6,577,504 B1 | 6/2003 | Lofland | | |
| 6,596,565 B1 | 7/2003 | Hembree | | |
| 6,710,442 B1 | 3/2004 | Lindgren et al. | | |
| 6,744,640 B2 | 6/2004 | Reis et al. | | |
| 6,979,594 B1 | 12/2005 | Fan et al. | | |
| 6,982,481 B1 | 1/2006 | Sonderegger et al. | | |
| 7,026,710 B2 | 4/2006 | Coyle et al. | | |
| 7,030,482 B2 | 4/2006 | Haines | | |
| 7,031,162 B2 | 4/2006 | Arvelo et al. | | |
| 7,116,557 B1 | 10/2006 | Raby et al. | | |
| 7,164,587 B1 | 1/2007 | Garnett et al. | | |
| 7,202,559 B2 * | 4/2007 | Zhao | ......................... | H01L 23/13 257/707 |
| 7,254,034 B2 | 8/2007 | Bolle et al. | | |
| 7,280,372 B2 * | 10/2007 | Grundy | ................... | H05K 1/183 361/792 |
| 7,286,729 B2 * | 10/2007 | Minamio | .......... | H01L 27/14618 385/14 |
| 7,440,256 B2 * | 10/2008 | Hongo | ................ | H01L 23/49805 257/E23.061 |

(56) References Cited

U.S. PATENT DOCUMENTS

| | | | |
|---|---|---|---|
| 7,529,095 B2 | 5/2009 | Whitton | |
| 7,586,190 B2 * | 9/2009 | Bogner | H01L 33/64 |
| | | | 257/100 |
| 7,656,043 B2 | 2/2010 | Huang | |
| 7,808,796 B2 * | 10/2010 | Hatanaka | H01L 23/552 |
| | | | 361/760 |
| 7,833,838 B2 | 11/2010 | Haines | |
| 9,713,258 B2 | 7/2017 | Kwark | |
| 2001/0006828 A1 * | 7/2001 | McMahon | H01L 25/18 |
| | | | 438/109 |
| 2001/0042907 A1 | 11/2001 | Tamaki et al. | |
| 2002/0114133 A1 * | 8/2002 | Ho | H01L 24/49 |
| | | | 361/704 |
| 2002/0144775 A1 * | 10/2002 | Tung | H01L 23/36 |
| | | | 156/303.1 |
| 2003/0209732 A1 | 11/2003 | Slupe et al. | |
| 2004/0087043 A1 | 5/2004 | Lee et al. | |
| 2004/0125579 A1 * | 7/2004 | Konishi | H01L 23/3121 |
| | | | 361/783 |
| 2004/0191490 A1 | 9/2004 | Hara et al. | |
| 2005/0012192 A1 * | 1/2005 | Saso | H01L 23/04 |
| | | | 257/678 |
| 2005/0103522 A1 | 5/2005 | Grundy et al. | |
| 2005/0104205 A1 | 5/2005 | Wang | |
| 2005/0117314 A1 | 6/2005 | Lien | |
| 2005/0121224 A1 | 6/2005 | Lien | |
| 2005/0163981 A1 | 7/2005 | Osthaus | |
| 2006/0012034 A1 | 1/2006 | Kadoya et al. | |
| 2006/0097370 A1 * | 5/2006 | Bartley | H01L 23/49838 |
| | | | 257/678 |
| 2007/0057364 A1 * | 3/2007 | Wang | H01L 33/642 |
| | | | 257/701 |
| 2007/0069371 A1 * | 3/2007 | Iksan | H01L 23/3128 |
| | | | 257/706 |
| 2007/0195505 A1 * | 8/2007 | Savignac | G11C 5/02 |
| | | | 361/719 |
| 2007/0235215 A1 | 10/2007 | Bathan et al. | |
| 2008/0192443 A1 | 8/2008 | Hatanaka et al. | |
| 2008/0277777 A1 | 11/2008 | Liao et al. | |
| 2017/0243802 A1 | 8/2017 | Kwark | |
| 2017/0243816 A1 | 8/2017 | Kwark | |

OTHER PUBLICATIONS

Office Action, dated Jun. 6, 2019 in U.S. Appl. No. 15/589,131.
United States Notice of Allowance dated Nov. 5, 2019 in U.S. Appl. No. 15/589,131.

\* cited by examiner

INTEGRATED CIRCUIT CHIP PACKAGING INCLUDING A HEAT SINK TOPPED CAVITY

The present application is a Continuation Application of U.S. patent application Ser. No. 11/411,920, filed on Apr. 27, 2006, the entire content of which is incorporated herein by reference.

FIELD OF THE INVENTION

The present invention generally relates to integrated circuit chip packaging. More particularly, the present invention relates to integrated circuit chip packaging connecting an integrated circuit chip to a conductive layer embedded between layers of a printed circuit board.

DESCRIPTION OF THE RELATED ART

Conventional methods and systems for connecting an integrated circuit chip to a printed circuit board have relied upon a surface attachment. A surface attachment restricts the launch to a conductive layer that is on the surface of a printed circuit board and if a signal from the integrated circuit chip must be launched into a conductive layer that is between the layers of the printed circuit board (i.e., an embedded conductor), then the signal is subject to problems, which may be caused by vias that are used to transfer the signal from the surface to the embedded conductor.

Conventionally, an integrated circuit chip may be placed into a carrier (e.g., a package) and the carrier may then be mounted onto a surface of the printed circuit board. Exemplary conventional techniques are shown in FIG. 1.

FIG. 1 shows a conventional surface mount package 102 and a conventional flip chip package mounting 104. The conventional flip chip package mounting 104 connects to the printed circuit board using two via configurations. A first configuration includes a via 106 that has a long stub 107 that extends past an embedded conductor layer 108. The flip chip 104 is electrically connected to the embedded conductor layer 108.

The second configuration includes a buried via 110 that does not include a lengthy stub and, therefore, avoids the signal degradation associated with a lengthy stub. However, a buried via 110 is more expensive to fabricate. The conventional surface mount package 102 also shows connection to another embedded conductor 111, which connects to the distal end of via 109. This configuration, referred to as a "through via," minimizes the length of the stub, but the presence of the via still leads to signal distortion.

In addition, if many signals try to connect to embedded conductors at the same level of a layer, then wiring congestion may result.

Integrated circuit chips that operate at high frequencies often rely on flip chip packaging to minimize the parasitics that are associated with conventional chip packages. For best performance, conventionally, the highest speed signals use conductive surface layers or buried vias in the printed circuit board in order to reduce a via stub effect that may compromise signal transmission.

SUMMARY OF THE INVENTION

In view of the foregoing and other exemplary problems, drawbacks, and disadvantages of the conventional methods and structures, an exemplary feature of the present invention is to provide an integrated circuit chip package in which a cavity in a printed circuit board receives an integrated circuit chip to connect to a conductor that is embedded between layers of a printed circuit board.

In a first exemplary aspect of the present invention, a printed circuit board has a cavity extending into a surface to a conductor that is embedded between layers of a printed circuit board, an integrated circuit chip is in the cavity, and an electrical connection connects the integrated circuit chip to the embedded conductor.

In a second exemplary aspect of the present invention, a method of mounting an integrated circuit chip to a printed circuit board includes providing a cavity extending from a surface of the printed circuit board to a conductor that is embedded between layers of a printed circuit board, placing the integrated circuit chip into the cavity, and electrically connecting the integrated circuit chip to the conductor.

In a third exemplary aspect of the present invention, a printed circuit board may include a plurality of insulating layers, a conductor embedded between two of the plurality of insulating layers, and a cavity extending from a surface of the printed circuit board to the embedded conductor.

The inventors of the present invention discovered that more direct access to a conductor that is embedded between layers of a printed circuit board is desired, without having to rely upon a surface mount or a via to connect to an embedded conductor.

A printed circuit board may include alternating stacks of patterned conductors, such as, for example, copper planes. Usually those planes are copper, in which case they may include ground planes or power planes. Alternatively, the planes are patterned into narrower traces to form conductors, which are sandwiched between layers to provide controlled impedance transmission lines. These conductors are, thus, embedded between layers of the printed circuit board and are particularly well suited to transmit high fidelity signals. Other signals, such as power, control connections, or the like, do not need controlled impedance lines and may have varying widths depending upon their functional needs.

An embedded conductor is superior to a surface conductor because an embedded conductor has better signal fidelity and an embedded conductor is completely shielded, while a surface conductor is not completely shielded. Therefore, an exemplary embodiment of the present invention is advantageous because the integrated circuit chips no longer need to connect to surface conductors, rather the integrated circuit chips may attach more directly to embedded conductors.

An exemplary embodiment of the present invention connects a chip to a conductor embedded between layers of a printed circuit board without using a via.

In an exemplary embodiment of the present invention, the printed circuit board may be milled to expose an embedded conductor into which a signal from an integrated circuit chip may be launched.

In an exemplary embodiment of the present invention, the milling may create a cavity that may be shaped to receive the integrated circuit chip.

In an exemplary embodiment of the present invention the cavity may be deep enough such that, when the cavity receives the chip, the top of the chip is substantially co-planar with an embedded conductor. In this manner, very short ribbon bonds may be connected between contacts on the chip to the substantially co-planar embedded conductor.

It is advantageous to minimize the length of a wire bond and/or a ribbon bond, because a bond represents a discontinuity. Therefore, milling the cavity such that the top of the chip is substantially co-planar with the launch, minimizes the length of a wire/ribbon bond and, as a result, reduces the adverse affects of the discontinuity.

A launch into an embedded conductor is generally capable of carrying a signal that incorporates frequency components that exceed 40 Ghz. Thus, an exemplary embodiment of the present invention is capable of handling signals incorporating a 40 Ghz component.

In an exemplary embodiment of the present invention, the printed circuit board includes a step-shaped (e.g., a terraced) side surface that may reveal launch points into a plurality of embedded conductors and non-controlled impedance traces, such as those used for control and power.

In general, the best launch exposed by the step-shaped structure is the one that is substantially co-planar with the top of a chip. The remaining launches may be used to handle slower and/or less critical signals.

In an exemplary embodiment of the present invention two integrated circuit chips may be connected by a high speed embedded conductor by placing each of these chips into cavities such that the tops of both chips are substantially co-planar with the same embedded conductor. In this manner, the present invention obviates the necessity of providing vias to connect the two chips to each other.

An exemplary embodiment of the present invention may use a precision engraving machine, rather than just a generic milling machine.

Further, an exemplary embodiment of the present invention may be adapted to either wire/ribbon bonding or to a flip chip implemenation. This packaging technique offers even higher performance than the conventional techniques mentioned above while at the same time being low in cost.

These and many other advantages may be achieved with the present invention.

BRIEF DESCRIPTION OF THE DRAWINGS

The foregoing and other exemplary purposes, aspects and advantages will be better understood from the following detailed description of an exemplary embodiment of the invention with reference to the drawings, in which.

DETAILED DESCRIPTION OF EXEMPLARY EMBODIMENTS OF THE INVENTION

Figure 1:
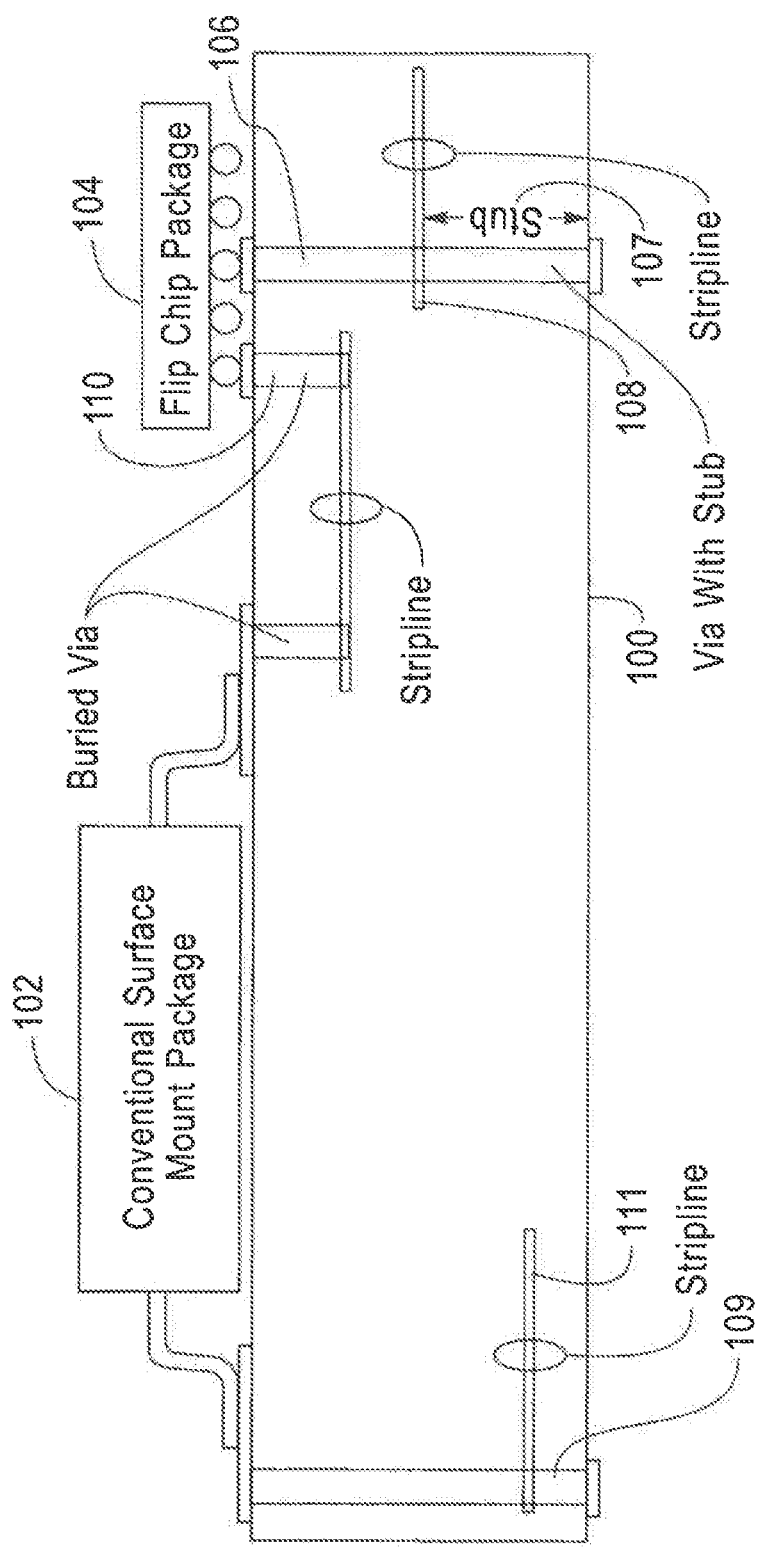
FIG. 1 is a cross-sectional view of a printed circuit board with two conventionally mounted integrated circuit chip packages.

Referring now to the drawings, and more particularly to FIGS. 1-5, there are shown exemplary embodiments of the method and structures of the present invention.

As explained above, there are many topologies conventionally available for implementing transmission lines in circuit boards (e.g., printed circuit boards (PCBs)). Internal embedded conductors, which may include an embedded conductor sandwiched between solid planes of a reference ground plane, offer many advantages over surface conductors. Embedded conductors support less dispersive transverse electric and magnetic modes which may be advantageous for wide band operation. An embedded conductor may also be self-shielding and, since they may undergo fewer processing steps than surface wiring they may be easier and less costly to fabricate.

Connecting an integrated circuit chip to embedded conductors conventionally requires the use of vias to connect from the surface of a printed circuit board where components are traditionally attached. However, if the overlying layers are removed from the printed circuit board in accordance with an exemplary embodiment of the present invention (e.g. by milling) these embedded conductors may permit a more direct attachment of these embedded conductors to high speed nets on a chip. A chip may be connected to an embedded conductor using a wire bond, a ribbon bond, or the like, or may be flip chip connected using solder balls, or the like.

Figure 2:
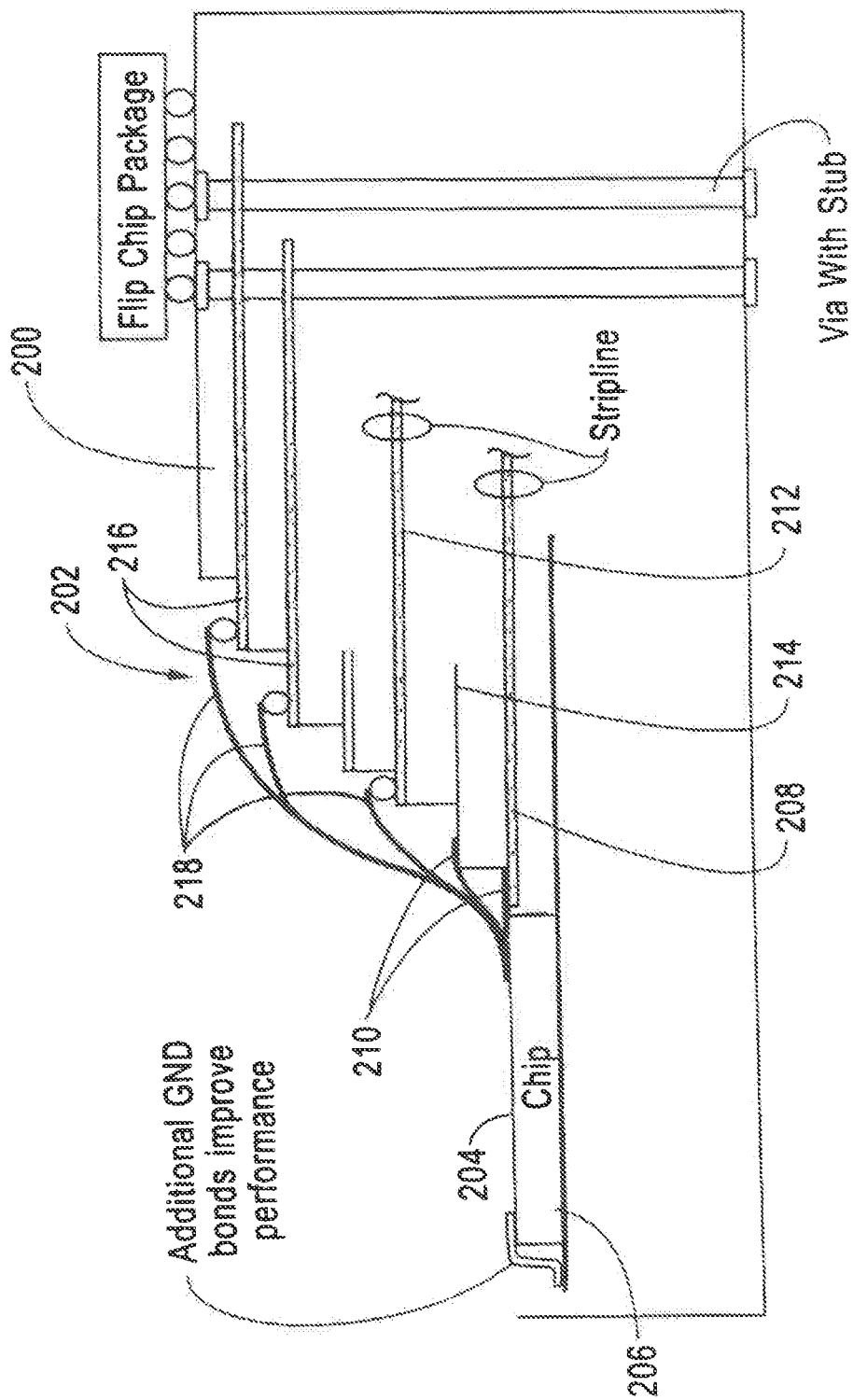
FIG. 2 is a cross-sectional view of an exemplary embodiment of the present invention.

As illustrated by FIG. 2, in accordance with an exemplary embodiment of the present invention, layers in a printed circuit board 200 may be milled back to create a cavity with a step-shaped side surface 202. As shown, the side surface may have a plurality of steps.

In other words, the outer surface of the printed circuit board may be milled to form a cavity that extends down to a desired embedded conductor. Further, a side of such a cavity may have a terraced profile (step-shaped side surface) wherein each step of the terraced profile exposes a surface of an embedded conductor.

In another exemplary embodiment of the present invention, after a cavity is formed in the printed circuit board, an exposed surface of the embedded conductor may be treated to facilitate bonding. For example, the surface may be plated with a metal (e.g., a noble metal such as gold, platinum, silver, and the like) to improve wire bonding and/or ribbon bonding.

In an exemplary embodiment of the present invention, the cavity in the printed circuit board extends deep enough into the printed circuit board such that a top of an integrated circuit chip positioned in the recess would be substantially co-planar with an embedded conductor. The embedded conductor may then be provided the highest speed signal more directly from the integrated circuit chip.

For example, in FIG. 2 the top surface 204 of the chip 206 is substantially co-planar with an embedded conductor 208. In this manner, an exemplary embodiment of the present invention offers a launch from the chip 206 into the printed circuit board more directly to a desired embedded conductor 208. The top of the chip 204 may be connected to the highest performance embedded conductor 208 with a ribbon bond 210 because a ribbon bond may offer a higher performance potential.

The step-shaped surface of the cavity may also reveal the surfaces of other embedded conductors, which are not substantially co-planar with a top of the chip. In general, as the distance from the top of the chip 204 to an embedded conductor increases, a longer connection will be required. A longer connection will generally offer poorer performance than a shorter connection and, therefore, the printed circuit board may be designed such that, as the distance between an embedded conductor and the top of the chip increases, the less critical a signal will be carried by that respective embedded conductor. For example, most low speed control lines do not require controlled impedance and, therefore, are insensitive to the longer distances that need to be bridged by a wire bond.

Further, the less critical connections may use lower performance connections such as, for example, a wire bond and/or a ball bond as opposed to a ribbon bond. However, one of ordinary skill in the art understands that any type of connection may be used to establish electrical communication between a chip and an embedded conductor and still practice the invention.

In the exemplary embodiment illustrated by FIG. 2, the embedded conductor 212, which is the next closest to the top of the chip 204, and a ground plane 214 are also connected to the chip using ribbon bonds 210.

Further, the next closest embedded conductors 216 to the top of the chip 204 are connected by ball bonds 218 to the chip 206.

FIG. 2 also illustrates a flip chip package 220, which may be connected to the printed circuit board 200 in a conventional manner.

A printed circuit board may be constructed by laminating many different layers together using, for example, are epoxy resin. That lamination may be done under a high temperature and a pressure to cure the resin. The resin essentially flows between the layers in a pattern sensitive manner depending upon what copper features happen to be nearby. Thus, the surfaces between the layers of a printed circuit board may not necessarily be planar. Rather, the surfaces of the layers may incorporate a bit of waviness depending upon the copper patterns.

Thus, when using a conventional milling machine and open-loop programming on the milling machine to mill down to a certain level into a printed circuit board, there is a likelihood that the milling might not reach a level that corresponds to the level of a desired embedded conductor. The thickness of a patterned copper layer of an embedded conductor is typically about 1 mil and the waviness of a reasonably thick layer of a printed circuit board is typically more than 1 mil. Therefore, a conventional milling machine may cut entirely through the embedded conductor, thereby, destroying the embedded conductor in some places, while simultaneously not even reaching the same embedded conductor in another place.

In an exemplary embodiment of the present invention, a precision milling machine may sense an electrical contact between a cutting edge of the milling machine and a stripline. In this manner, the milling machine may incorporate a closed-loop feedback system that regulates the depth of the milling into the printed circuit board.

In another exemplary embodiment of the present invention, a closed-loop feedback might not electrically sense the patterned layer of the desired embedded conductor in order to control the depth of the milling process. Rather, a calibration structure that may closely track the local internal waviness may be provided which provides a desired feedback control signal. This may be accomplished either electrically, with optical recognition, or by analyzing the chips as they are received from the milling operation. When copper chips are detected, then the desired target layer has been reached.

Before connecting the leads, but after milling, an embedded conductor may have a bare surface. In an exemplary embodiment of the present invention, the bare surfaces of the embedded conductor may be plated with a material, which facilitates bonding. A material for plating may include, for example, gold and the like, which may be electro-lessly plated onto a surface of an embedded conductor.

Alternatively, if a thicker gold layer is required, then a sacrificial plating web may be patterned in the copper and subsequently milled away.

Although not shown in the Figures, ground planes in a printed circuit board may be electrically connected to each other using a via in close proximity to the milled cavity in order to maintain tight coupling between the planes for embedded conductor integrity.

Figure 3:
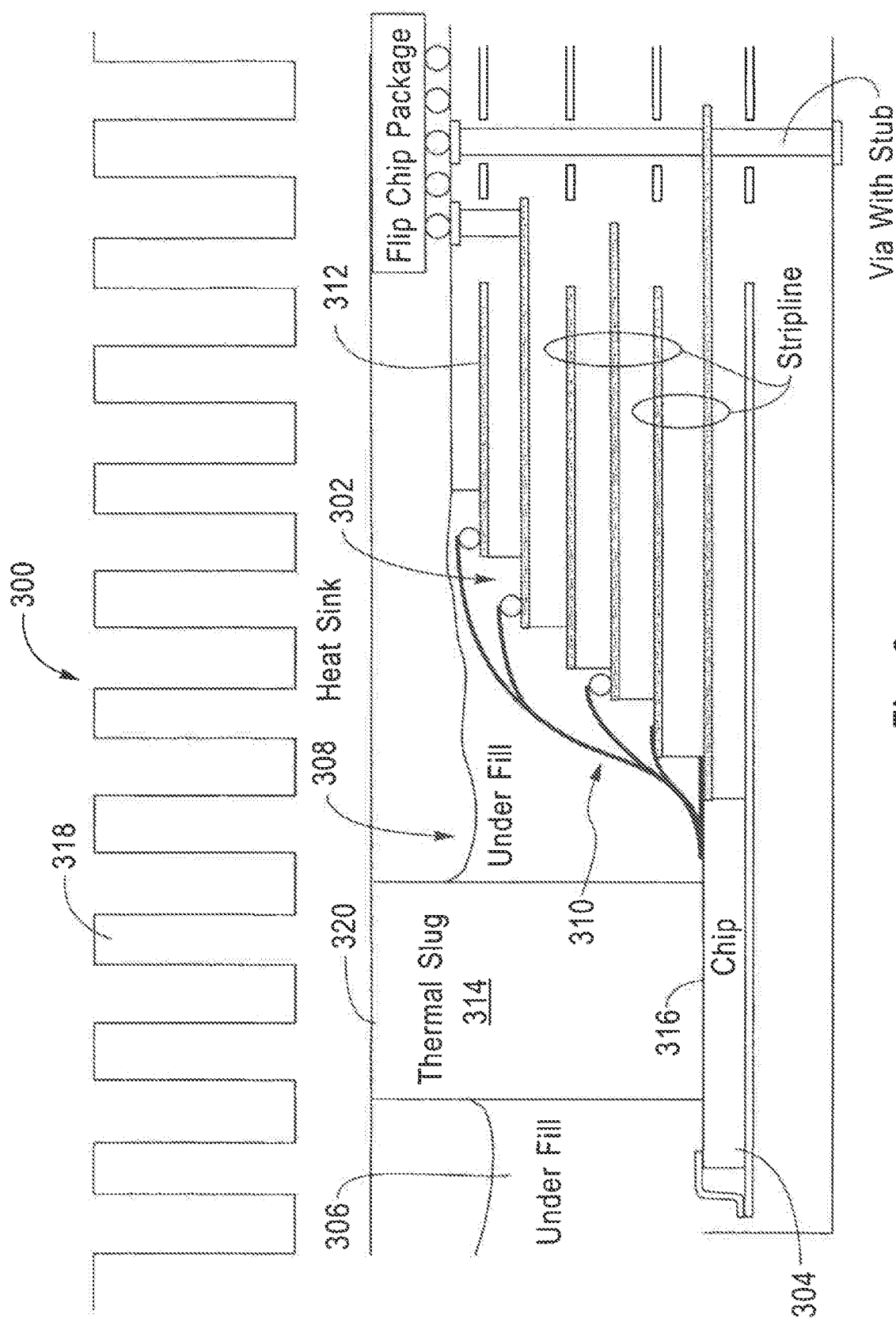
FIG. 3 is a cross-sectional view of the exemplary embodiment of FIG. 2 in a passivated configuration.

FIG. 3 illustrates an exemplary embodiment of a printed circuit board 300 in accordance with the present invention. The step-shaped surface 302 and the chip 304 are incorporated into the printed circuit board 300 in a final passivated configuration. The printed circuit board 300 includes an underfill material 306 which fills the recess 308 in the printed circuit board 300 to protect the chip 304 and the connections 310 from the chip 304 to the embedded conductors 312 within the printed circuit board 300.

The printed circuit board 300 also includes a thermal slug 314 mounted to a top surface 316 of the chip 304 and a heat sink 318 mounted to an outer surface 320 of the thermal slug 314 to conduct thermal energy away from the printed circuit board 300.

In another exemplary embodiment in accordance with the present invention (not shown), the chip may be accessed from the backside for thermal management.

Figure 4:
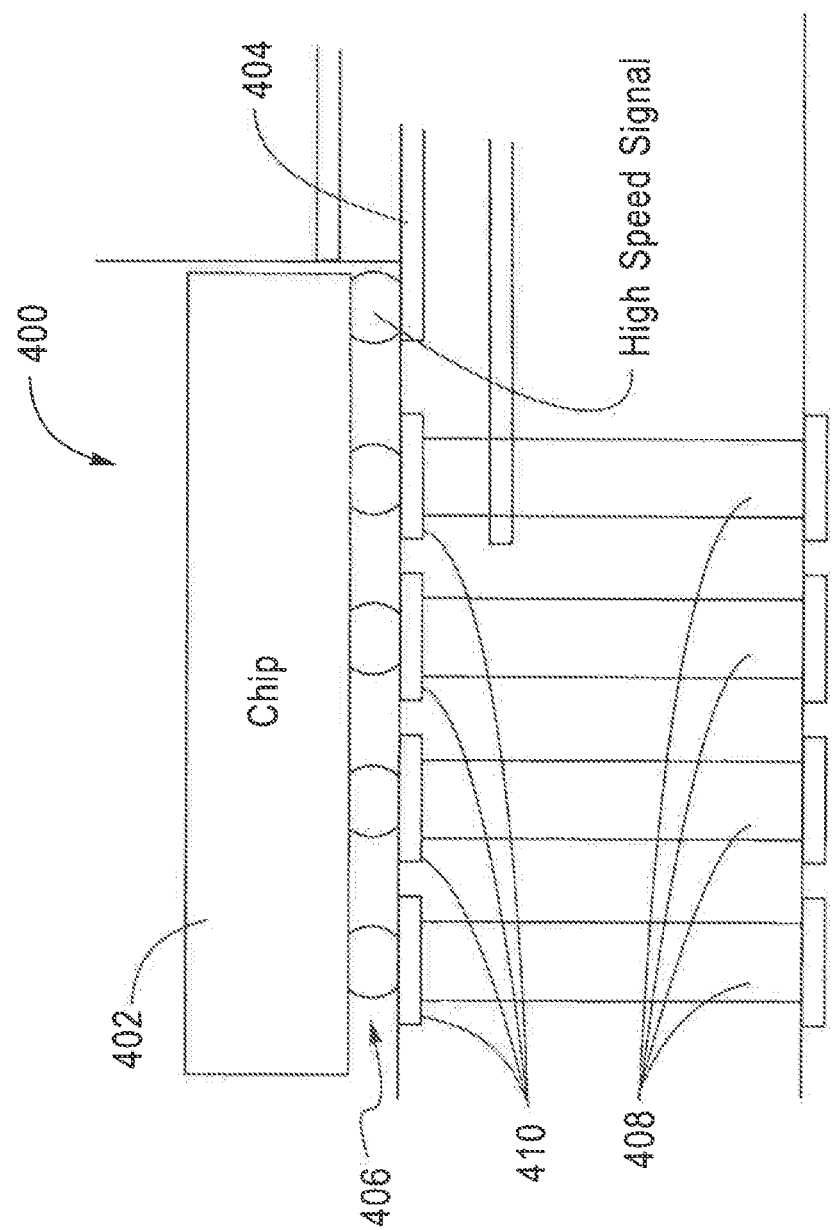
FIG. 4 is a cross-sectional view of another exemplary embodiment of the present invention.

As illustrated by FIG. 4, an exemplary embodiment 400 of the invention may permit a chip 402 to connect with an embedded conductor 404 using a flip chip connection 406.

The other vias 408 supporting the non-embedded conductor signals from the chip 402 are not buried vias, but are typical through vias that have pads 410 at the level of the embedded conductor 404.

In accordance with an exemplary embodiment of the present invention, these pads 410 may be revealed in the course of milling a cavity into the printed circuit board. This exemplary method maintains the low cost of through via construction by avoiding the use of buried vias.

Figure 5:
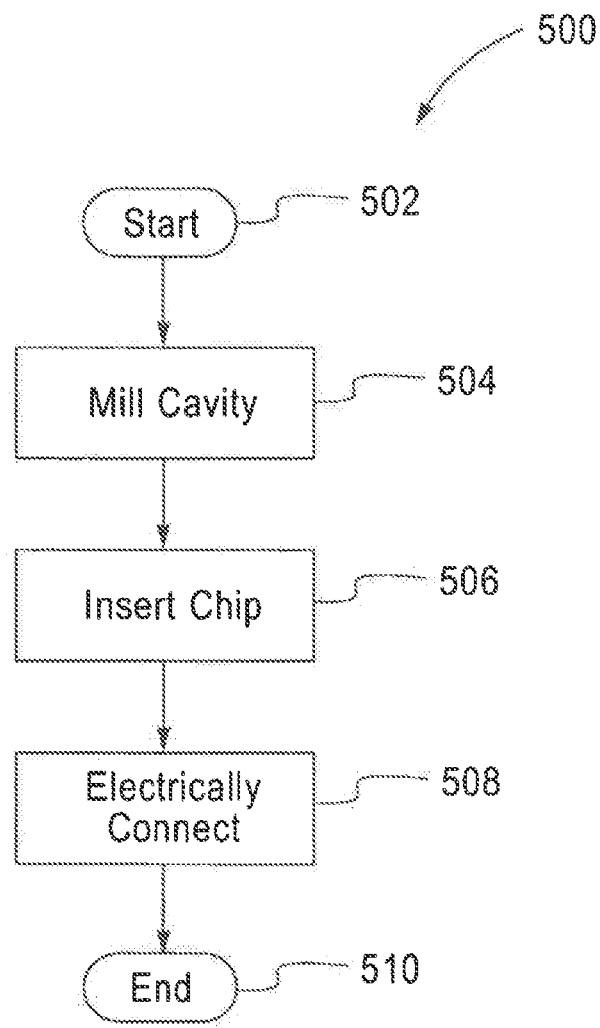
FIG. 5 is a flowchart of a exemplary method in accordance with the present invention.

FIG. 5 illustrates a flowchart 5 for an exemplary method in accordance with the present invention. The flowchart 500 starts at step 502 and continues to step 504 where a cavity is milled into a circuit board to expose an embedded conductor. The flowchart 500 continues to step 506 where an integrated circuit chip is positioned inside the cavity. Next, in step 508, the integrated circuit chip is electrically connected to the embedded conductor that was exposed in step 504. The flowchart ends at step 510.

While the invention has been described in terms of several exemplary embodiments, those skilled in the art will recognize that the invention can be practiced with modification.

Further, it is noted that, Applicant's intent is to encompass equivalents of all claim elements, even if amended later during prosecution.

What is claimed is:

1. An electrical circuit device, comprising:
   a printed circuit board including a cavity extending from a top surface of the printed circuit hoard to an embedded conductor;
   an integrated circuit chip disposed in said cavity;
   an electrical connection between said integrated circuit chip and said embedded conductor;
   a thermal slug disposed over a top surface of said integrated circuit chip; and
   a heat sink mounted to an outer surface of the thermal slug for transferring a thermal energy away from the printed circuit board.

2. The device of claim 1, wherein a top surface of said integrated circuit chip is substantially co-planar with said embedded conductor.

3. The device of claim 1, wherein said cavity comprises a side surface with a step.

4. The device of claim 3, wherein a top surface of said step is aligned with another embedded conductor.

5. The device of claim 3, wherein a top surface of said step exposes said embedded conductor.

6. The device of claim 1, further comprising a plurality of connections each electrically connecting said integrated circuit chip to a corresponding one of a plurality of embedded conductors.

7. The device of claim 6, wherein one of said plurality of connections comprises one of a ball bond and a ribbon bond.

8. The device of claim 1, wherein said electrical connection comprises a ribbon bond.

9. The device of claim 1, wherein said electrical connection comprises a flip chip connection and a ball bond connection.

10. The device of claim 1, wherein the cavity extends from the top surface of said printed circuit board to a top surface of the embedded conductor.

11. The device of claim 10, wherein said printed circuit board is disposed on the top surface of said embedded conductor and on a bottom surface of said embedded conductor.

12. The device of claim 11, wherein the integrated circuit chip is disposed on a lower surface of said cavity inside said printed circuit board such that said printed circuit board extends below the integrated circuit chip and covers a side surface of the integrated circuit chip.

13. The device of claim 12, wherein said electrical connection between said integrated circuit chip and said embedded conductor comprises a ribbon bond.

14. The device of claim 13, further comprising:
a plurality of connections each electrically connecting said integrated circuit chip to a corresponding one of a plurality of embedded conductors, which are embedded within the printed circuit board in addition to the embedded conductor.

15. The device of claim 14, wherein an upper one of said plurality of connections comprises a ball bond that connects said integrated circuit chip to an upper one of the plurality of embedded conductors.

16. The device of claim 15, wherein said each of the plurality of connections and each of the plurality of embedded conductors are located between the side surface of the integrated circuit chip and a flip chip package connected to the printed circuit board.

17. The device of claim 16, wherein the heat sink extends above a top surface of said printed circuit board.

18. The device of claim 16, wherein thermal slug is disposed on the top surface of said integrated circuit chip.

19. An electrical circuit device, comprising:
an insulating layer;
a plurality of conductors embedded in the insulating layer;
a cavity extending from a surface of the insulating layer to a top surface of each of the plurality of conductors such that the top surface of said each of the plurality of conductors is exposed in the cavity;
an integrated circuit chip disposed in the cavity; and
a plurality of connectors disposed in the cavity to electrically connect at least the top surface of a top conductor of the plurality of connectors and the top surface of a bottom conductor of the plurality of connectors to a top surface of the integrated circuit chip,
wherein the top surface of the integrated circuit chip is substantially co-planar with the top surface of the bottom conductor of the plurality of connectors such that the insulating layer is disposed on a side surface of the integrated circuit chip.

20. An electrical circuit device, comprising:
an insulating layer;
a conductor embedded in the insulating layer;
a cavity extending from a surface of the insulating layer to the conductor;
an integrated circuit chip disposed in the cavity; and
a thermal slug disposed over a top surface of the integrated circuit chip for transferring a thermal energy away from the insulating layer.

* * * * *